(12) United States Patent
Chung

(10) Patent No.: US 6,778,464 B2
(45) Date of Patent: Aug. 17, 2004

(54) EXPANDED OPERATING FREQUENCY SYNCHRONOUS SEMICONDUCTOR MEMORY DEVICE HAVING WAVE PIPELINE STRUCTURE AND WAVE PIPELINE CONTROL METHOD THEREOF

(75) Inventor: Dae-hyun Chung, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/288,830

(22) Filed: Nov. 6, 2002

(65) Prior Publication Data

US 2003/0086330 A1 May 8, 2003

(30) Foreign Application Priority Data

Nov. 7, 2001 (KR) .................................... 2001-0069227

(51) Int. Cl.⁷ ............................................... G11C 8/00
(52) U.S. Cl. ................... 365/233; 365/189.05; 365/194
(58) Field of Search ........................... 365/233, 189.05, 365/194, 241, 236, 189.02, 219

(56) References Cited

U.S. PATENT DOCUMENTS 6,473,360 B2 * 10/2002 Ooishi ........................ 365/233

* cited by examiner

Primary Examiner—David Lam
(74) Attorney, Agent, or Firm—Myers Bigel Sibley & Sajovec, P.A.

(57) ABSTRACT

Synchronous semiconductor memory devices and methods of operating are provided. The device has a latency N and includes a memory cell array, a stack unit having N storage units and a frequency detector that provides an output signal based on the relationship of the frequency of operation clock to a predetermined frequency. A control circuit controls the stack unit in response to the output signal of the frequency detector. The control circuit latches data read from the memory and controls the stack unit so that the latched data is stored from a clock cycle when a read command is sent until an N-th cycle afterwards if the clock frequency is greater than the predetermined frequency and delays the latched data for one cycle and controls the stack unit so that the delayed data is stored from one cycle after the read command is sent until an N+1 cycle afterwards.

28 Claims, 7 Drawing Sheets

EXPANDED OPERATING FREQUENCY SYNCHRONOUS SEMICONDUCTOR MEMORY DEVICE HAVING WAVE PIPELINE STRUCTURE AND WAVE PIPELINE CONTROL METHOD THEREOF

RELATED APPLICATIONS

This application claims priority to Korean Patent Application No. 2001-69227, filed on Nov. 7, 2001, the contents of which are herein incorporated by reference in their entirety.

FIELD OF THE INVENTION

The present invention relates to a synchronous semiconductor memory, and more particularly, to a synchronous semiconductor memory device having a wave pipeline and a wave pipeline control method.

BACKGROUND OF THE INVENTION

In digital systems, including a synchronous semiconductor memory device that operates synchronized with a system clock, latency typically increases as the frequency of the system clock increases. In response to the increasing latency, a wave pipeline has been used to control the latency in the synchronous semiconductor memory device. Latency refers to the number of cycles of the system clock that are needed to perform a read operation. Latency is typically measured as the time from when a read command is sent to a synchronous semiconductor memory device until a time when a first data item is output.

FIG. 1 is a diagram of a Double Data Rate (DDR) synchronous dynamic random access memory (DRAM) having a prior art wave pipeline structure. In the DRAM of FIG. 1, the latency is N cycles (N is an integer). FIG. 2 is a timing diagram of data outputs of the DDR synchronous DRAM of FIG. 1.

Because the latency is N, a stack unit 14 has N stack registers or storage units, and a stack counter 17 generates a signal (SC) that is activated with a period of N cycles of the system clock. The stack unit 14 stores data (DATA) that is read from a memory cell array 10 for N cycles of the system clock (CLK) in response to the output signal (SC) of the stack counter 17. When a read command (READ) is input, data (DATA) is read from the memory cell array 10 through a sense amplifier 11, a column selection transistor 12, and a latch 13.

Data stored in the stack unit 14 is sequentially output through a parallel to serial converter 15 and an output buffer 16. The parallel to serial converter 15 is controlled by a clock that is obtained when a latency control circuit 19 delays a control clock (CLKDQ) generated in a delay synchronization loop (DLL) 18 for a predetermined time.

However, when the synchronous DRAM shown in FIG. 1 operates at a low frequency, that is, when the frequency of the system (CLK) is a low frequency, failure may occur because data is not stably latched at the falling edge of the system clock (CLK) as shown in the timing diagram of FIG. 3. For example, when Ta denotes a time for stably storing a first data item 00 in the stack unit 14 after a read command (READ) is input, and Tb denotes a time for aligning the data to the falling edge of the system clock (CLK) from the rising edge of the control clock (CLKDQ) generated in the DLL 18 to the falling edge of the system clock (CLK), if Ta+Tb is less than TCC/2, a failure occurs. TCC denotes the cycle or period of the system clock (CLK).

This failure of a low frequency operation can be prevented by increasing the number of stacks in the stack unit 14 by 1. For example, if the number of stacks in the stack unit 14 is N+1, the stack unit 14 stores data (DATA) for N+1 cycles of the system clock (CLK), and accordingly a time for stably latching the first data item 00 after the read command (READ) is input increases to Ta+TCC. Therefore, Ta+TCC+Tb becomes greater than TCC/2 and the failure of a low frequency operation can be prevented.

Thus, in the synchronous DRAM shown in FIG. 1, by increasing the number of stacks of the stack unit 14 by 1, the failure of a low frequency operation can be prevented. However, as a result of the increase in the number of stacks, the characteristics of a high frequency may be degraded.

SUMMARY OF THE INVENTION

Embodiments of the present invention provide a synchronous semiconductor memory device that operates synchronized with an operation clock. The synchronous semiconductor memory device has a latency N, where N is an integer and includes a memory cell array, a stack unit having N storage units and a frequency detector configured to determine a relationship of a frequency of the operation clock with reference to a predetermined frequency so as to provide an output signal based on the relationship of the frequency of the operation clock to the predetermined frequency. A control circuit is configured to control the stack unit in response to the output signal of the frequency detector. The control circuit latches data read from the memory cell array and controls the stack unit so that the latched data is stored from a clock cycle when a read command is sent until an N-th clock cycle after the read command is sent if the frequency of the operation clock is greater than the predetermined frequency and delays the latched data for one clock cycle and controls the stack unit so that the delayed data is stored from one clock cycle after the read command is sent until an N+1 clock cycle after the read command is sent.

In further embodiments of the present invention, the frequency detector includes a first latch that latches a reference signal in response to a first edge of the operation clock and a second latch that latches the reference signal in response to a second edge of the operation clock. A first delay unit that delays the output signal of the first latch for a first delay time and a second delay unit that delays the output signal of the first delay unit for a second delay time. A third latch latches an output signal of the second latch in response to a first edge of an output signal of the second delay unit and outputs the latched value as the output signal of the frequency detector. In particular embodiments of the present invention, the first edge of the operation clock is a rising edge of the operation clock, the second edge of the operation clock is a falling edge of the operation clock and the first edge of the output signal of the second delay unit is a rising edge of the output signal of the second delay unit.

In still further embodiments of the present invention, the predetermined frequency has a period of twice a sum of the delay of the first delay unit and the delay of the second delay unit. For example, the first delay time may be a time for the stack unit to stably store a first data item of the latched data after the read command is sent. The second delay time may be a time from the rising edge of a control clock generated in a delay synchronization loop in the synchronous semiconductor memory device to a falling edge of the operation clock.

In additional embodiments of the present invention, the predetermined frequency has a period of twice a sum of a time for the stack unit to stably store a first data item of the latched data after the read command is sent and a time from the rising edge of a control clock generated in a delay synchronization loop in the synchronous semiconductor memory device to a falling edge of the operation clock.

In yet other embodiments of the present invention, the control circuit includes a first latch that latches internal data read from the memory cell array in response to a first control signal and a second latch that latches data latched by the first latch in response to a second control signal, and outputs the latched data as the delayed data. A first selector selects one of the data latched by the first latch and the delayed data in response to the output signal of the frequency detector, and outputs the selected data to the stack unit. A second selector selects one of the first control signal and the second control signal in response to the output signal of the frequency detector. A stack counter counts pulses of the output signal of the second selector and outputs an output signal to the stack unit based on the counted pulses. In certain embodiments, the first control signal is a signal having pulses activated at every cycle from a clock cycle when the read command is sent until an N-th clock cycle after the read command is sent, if the frequency of the operation clock is at least the predetermined frequency. Furthermore, the second control signal may be a signal having pulses activated at every cycle from one clock cycle after when a read command is sent until an N+1 clock cycle after the read command is set, if the frequency of the operation clock is less than the predetermined frequency.

In still additional embodiments of the present invention, the stack counter counts the pulses of the first control signal when the first control signal is input through the second selector, and activates the output signal with a period of N cycles from a clock cycle when the read command is sent until the N-th clock cycle. The stack counter may also count the pulses of the second control signal when the second control signal is input through the second selector, and activate the output signal with a period of N cycles from one clock cycle after when the read command is sent until N+1 clock cycles after the read command is sent.

In other embodiments of the present invention, asynchronous semiconductor memory device that operates synchronized with an operation clock and having a latency of N, where N is an integer, includes a memory cell array and a frequency detector that provides an output signal based on a relationship between a frequency of the operation clock and a predetermined frequency. A latch circuit, responsive to the output signal of frequency detector, latches data read from the memory cell array if the frequency of the operation clock is at least the predetermined frequency and outputs latched data from a clock cycle when a read command is sent until an N-th clock cycle after the read command is sent, and delays the latched data for one clock cycle if the frequency of the operation clock is less than the predetermined frequency and outputs the delayed data from one clock cycle after the read command is sent until N+1 clock cycles after the read command is sent. A stack counter activates an output signal with a period of N cycles from a clock cycle when the read command is sent until the N-th clock cycle after the read command is sent if the frequency of the operation clock is at least the predetermined frequency and activates the output signal with a period of N cycles from one clock cycle after when the read command is sent until N+1 clock cycles after the read command is sent if the frequency of the operation clock is less than the predetermined frequency. A stack unit is responsive to the output signal of the stack counter and stores the latched data from a clock cycle when the read command is sent until the N-th clock cycle after the read command is sent if the frequency of the operation clock is at least the predetermined frequency and stores the delayed data from one clock cycle after when the read command is sent until the N+1 clock cycle after the read command is sent if the frequency of the operation clock is less than the predetermined frequency.

In such embodiments, the frequency detector may include a first latch that latches a reference signal in response to a first edge of the operation clock, a second latch that latches the reference signal in response to a second edge of the operation clock, a first delay unit that delays an output signal of the first latch for a first delay time, a second delay unit that delays an output signal of the first delay for a second delay time and a third latch that latches an output signal of the second latch in response to the output signal of the second delay unit and outputs the latched value as the output signal of the frequency detector. The first edge of the operation clock may be a rising edge of the operation clock, the second edge of the operation clock may be a falling edge of the operation clock and the third latch may latch the output signal of the second latch on a rising edge of the output signal of the second delay unit.

Furthermore, the predetermined frequency may have a period of twice a sum of the delay of the first delay unit and the delay of the second delay unit. The first delay time may be a time for the stack unit to stably store a first data item of the latched data after the read command is sent. The second delay time may be a time from the rising edge of a control clock generated in a delay synchronization loop in the synchronous semiconductor memory device to a falling edge of the operation clock. The predetermined frequency may have a period of twice a sum of a time for the stack unit to stably store a first data item of the latched data after the read command is sent and a time from the rising edge of a control clock generated in a delay synchronization loop in the synchronous semiconductor memory device to a falling edge of the operation clock.

In still further embodiments of the present invention, the control circuit includes a first latch that latches internal data read from the memory cell array in response to a first control signal so as to provide internal latched data, a second latch that latches the internal latched data in response to a second control signal, and outputs the latched internal latched data as the delayed data and a selector unit responsive to the output signal of the frequency detector that selects the internal latched data when the frequency of the operation clock is at least the predetermined frequency or selects the delayed data when the frequency of the operation clock is less than the predetermined frequency, and outputs the selected data to the stack unit. The first control signal may have pulses activated at every cycle from a clock cycle when the read command is sent until an N-th clock cycle after the read command is sent, if the frequency of the operation clock is at least the predetermined frequency. The second control signal may have pulses activated at every cycle from one clock cycle after when a read command is sent until N+1 clock cycles after the read command is sent, if the frequency of the operation clock is less than the predetermined frequency.

In yet other embodiments of the present invention, a wave pipeline synchronous semiconductor memory device that operates synchronized with an operation clock and has a latency N, where N is an integer, is controlled by determining a relationship between the frequency of the operation clock and a predetermined frequency. Data read from a memory cell array is latched from a clock cycle when a read command is sent to the memory cell array until an N-th clock cycle after the read command is sent. The data latched from the memory cell array is delayed for one clock cycle. The latched data or the delayed data are selectively stored in a stack unit based on the determined relationship between the frequency of the operation clock and the predetermined frequency.

In further embodiments of the present invention, delaying the latched data is provided by delaying data latched from the memory cell array for one clock cycle if the frequency of the operation clock is less than the predetermined frequency. Furthermore, selectively storing the data may be provided by storing the latched data in the stack unit if the frequency of the operation clock is at least the predetermined frequency and storing the delayed data in the stack unit if the frequency of the operation clock is less than the predetermined frequency.

Additionally, the predetermined frequency is a frequency may have a period of twice a sum of a first time that is needed in stably store a first data item of the latched data after the read command is sent in the stack unit and a second time from a first edge of a control clock generated in a delay synchronization loop in the synchronous semiconductor memory device to a second edge of the operation clock.

DESCRIPTION OF THE PREFERRED EMBODIMENTS

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art.

Figure 1:
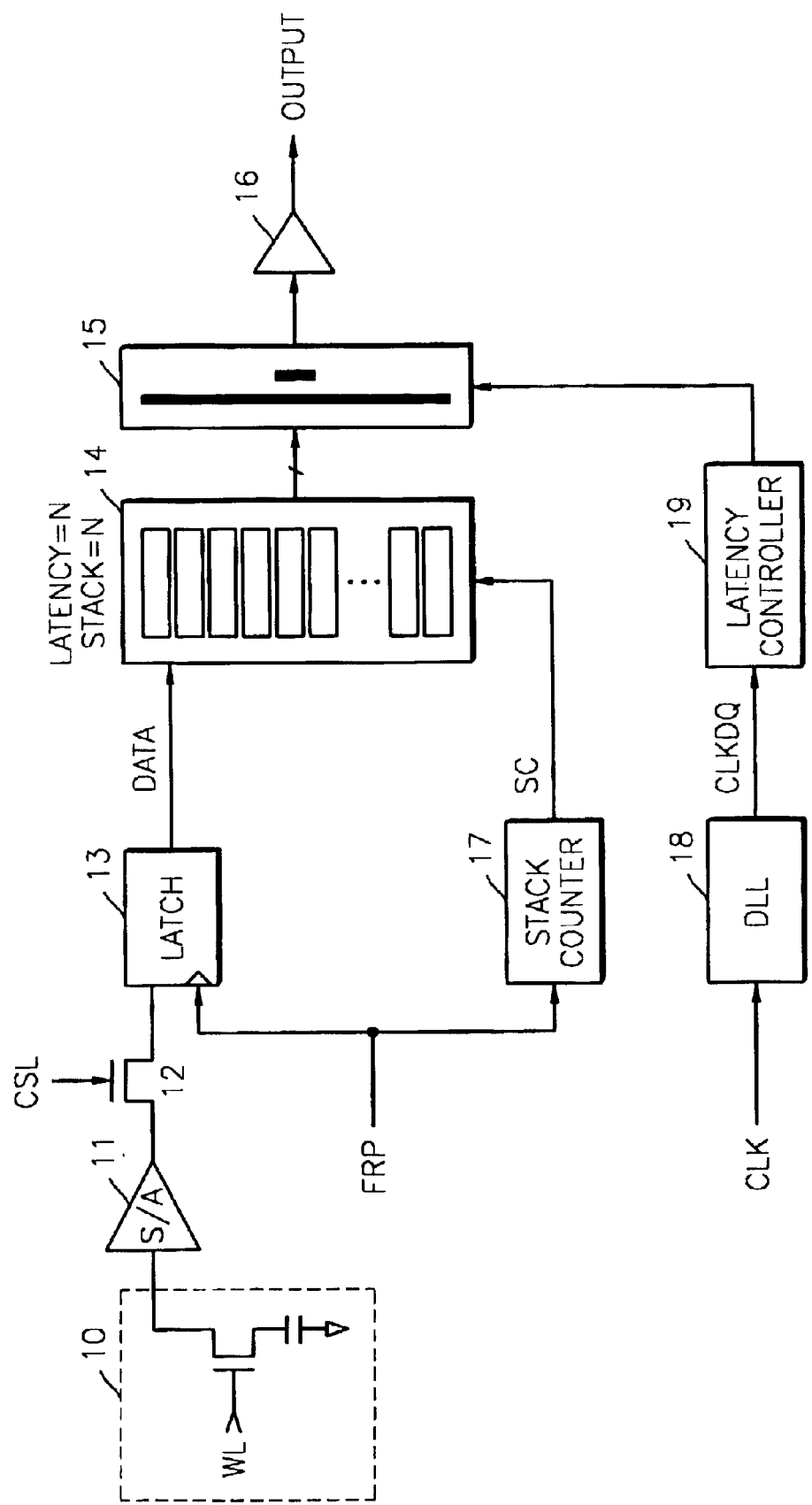
FIG. 1 is a diagram of a Double Data Rate (DDR) synchronous DRAM having a prior art wave pipeline structure.
Figure 2:
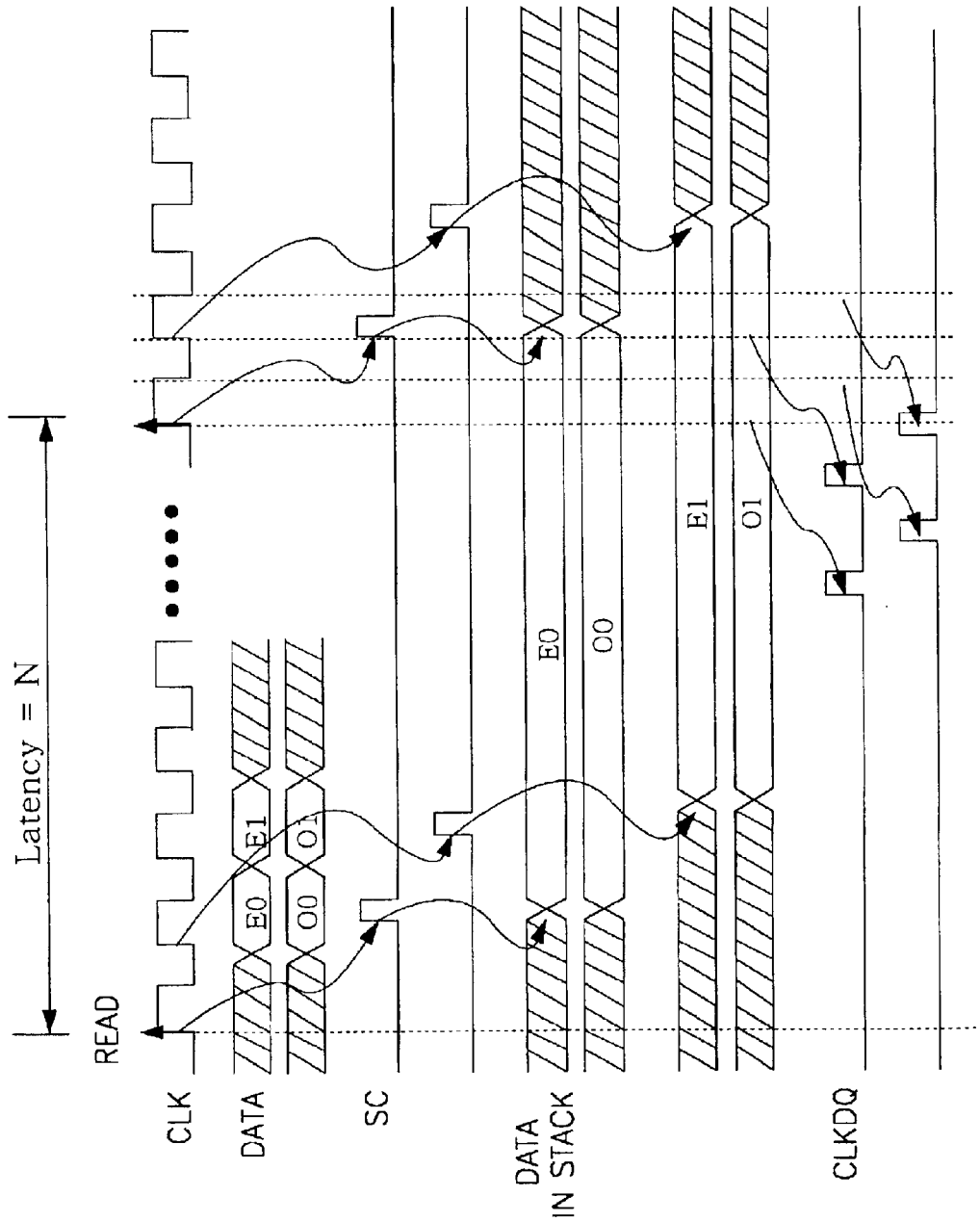
FIG. 2 is a timing diagram of data outputs of the DDR synchronous DRAM of FIG. 1.
Figure 3:
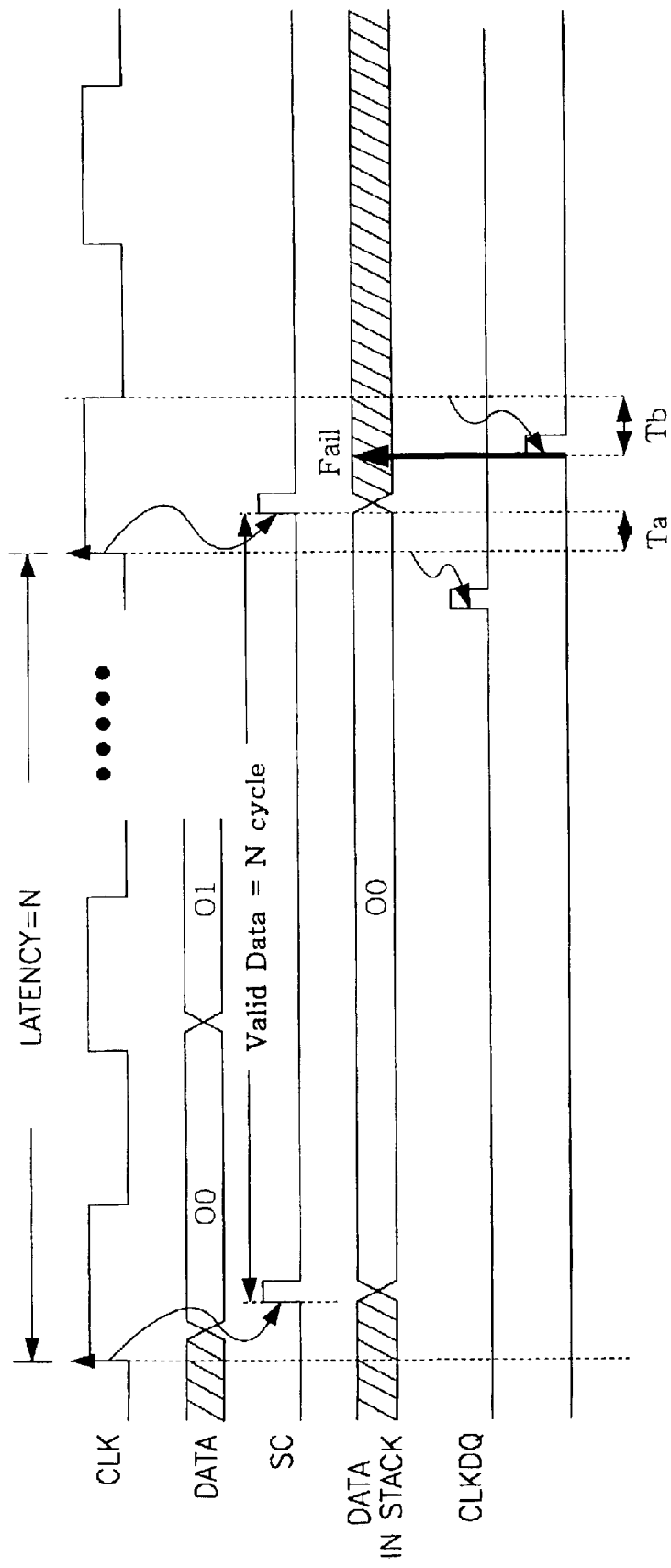
FIG. 3 is a timing diagram of a case in which the synchronous DRAM of FIG. 1 fails when operating at a low frequency.
Figure 4:
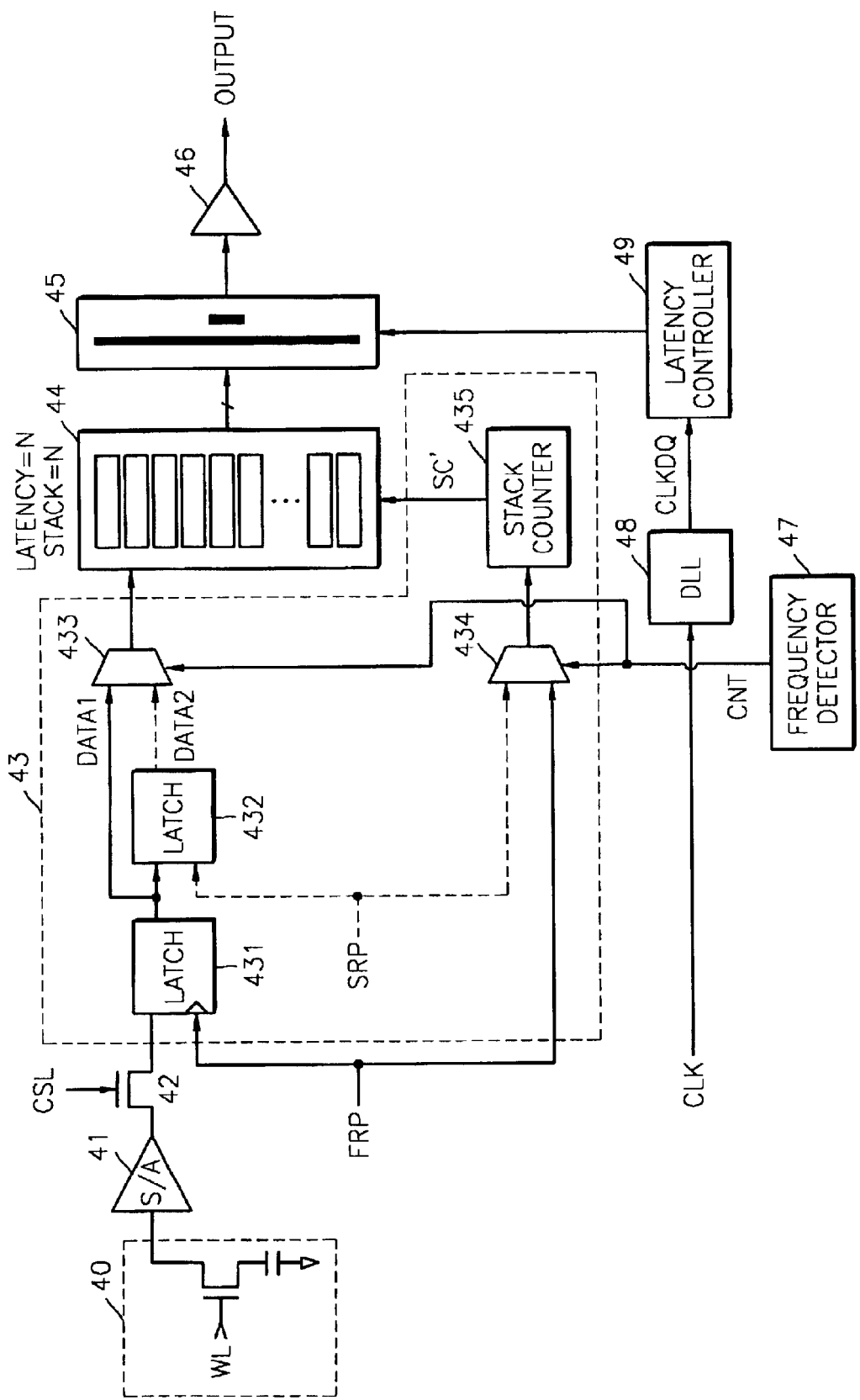
FIG. 4 is a diagram of a DDR synchronous DRAM having a wave pipeline structure according to embodiments of the present invention.

FIG. 4 is a diagram of a DDR synchronous DRAM having a wave pipeline structure of latency N (N is an itenger) according to embodiments of the present invention. Referring to FIG. 4, the DDR synchronous DRAM having a wave pipeline structure according to certain embodiments of the present invention includes a memory cell array 40, a sense amplifier 41, a column selection transistor 42, a control circuit 43, a stack unit 44, a parallel to serial converter 45, an output buffer 46, a frequency detector 47, a delay synchronization loop 48, and a latency controller 49.

Since the latency is N, the stack unit 44 has N stack registers or storage units. The frequency detector 47 detects a system clock (CLK), that is, the frequency of an operation clock, and the control circuit 43 controls the stack unit 44 in response to the output signal (CNT) of the frequency detector 47.

More specifically, when the frequency of the operation clock (CLK) detected by the frequency detector 47 is equal to or greater than a predetermined frequency, the control circuit 43 controls the stack unit 44 so that data (DATA1) latched from the memory cell array 40 is stored in the stack unit 44 from a clock cycle when a read command is sent until the N-th clock cycle. When the frequency of the operation clock (CLK) detected by the frequency detector 47 is less than the predetermined frequency, the control circuit 43 controls the DRAM so that data (DATA1) is delayed for one clock cycle and the delayed data (DATA2) is stored in the stack unit 44 from one clock cycle after when a read command is sent until the N+1 clock cycle.

In some embodiments of the present invention, the control circuit 43 is provided by a first latch 431, a second latch 432, a first multiplexer 433, a second multiplexer 434, and a stack counter 435. The first latch 431 latches data that is read from the memory cell array 40 through the sense amplifier 41 and the column selection transistor 42, in response to activation of a control signal (FRP), and outputs the latched data as data (DATA1). The second latch 432 latches data (DATA1) in response to activation of the control signal (SRP), and outputs the latched data as data (DATA2).

The control signal (FRP) is a signal which has pulses which are activated at every cycle from a clock cycle when a read command is sent until the N-th clock cycle when the frequency of the operation clock (CLK) detected by the frequency detector 47 is equal to or greater than a predetermined frequency. A control signal (SRP) is a signal which has pulses which are activated at every cycle from one clock cycle after a read command is sent until the N+1 clock cycle (e.g. FRP delayed one clock cycle) when the frequency of the operation clock (CLK) is less than the predetermined frequency. Therefore, when the frequency of the operation clock (CLK) detected by the frequency detector 47 is a low frequency (i.e. below the predetermined frequency), data (DATA1) is delayed for one clock cycle by the latch 432, and the delayed data is output as data (DATA2).

The first multiplexer 433 selects data (DATA1) and outputs it to the stack unit 44 when the output signal (CNT) of the frequency detector 47 is a first logic level, and selects data (DATA2) and outputs it to the stack unit 44 when the output signal (CNT) of the frequency detector 47 is a second logic level. The second multiplexer 434 selects the control signal (FRP) and outputs it to the stack counter 435 when the output signal (CNT) of the frequency detector 47 is the first logic level, and selects the control signal (SRP) and outputs it to the stack counter 435 when the output signal (CNT) is the second logic level.

The output signal (CNT) is the first logic level, for example, a "high" logic level, when the frequency of the operation clock (CLK) detected by the frequency detector 47 is equal to or greater than the predetermined frequency and is the second logic level, for example, a "low" logic level, when the frequency of the operation clock (CLK) detected by the frequency detector 47 is less than the predetermined frequency. Therefore, when the frequency of the operation clock (CLK) detected by the frequency detector 47 is equal to or greater than the predetermined frequency a path represented by the solid line in the control circuit 43 is selected and when the frequency of the operation clock (CLK) detected by the frequency detector 47 is less than the predetermined frequency the path represented by the dotted line in the control circuit 43 is selected.

The stack counter 435 generates an output signal (SC') in response to the control signal (FRP) or the control signal (SRP) that is input through the multiplexer 435, and provides the output signal (SC') to the stack unit 44. When the control signal (FRP) is input, the stack counter 435 counts the pulses of the control signal (FRP) and activates the output signal (SC') with a period of N cycles from a clock cycle when a read command is input until the N-th clock cycle. When the control signal (SRP) is input, the stack counter 435 counts the pulses of the control signal (SRP) and activates the output signal (SC') with a period of N cycles from one clock cycle after the read command is sent until the n+1 clock cycle. Accordingly, the stack unit 44 stores data (DATA1) from the clock cycle when the read command is sent until the N-th clock cycle when the frequency of the operation clock detected by the frequency detector 47 is equal to or greater than the predetermined frequency. The stack unit 44 stores data (DATA2) from one clock cycle after the read command is sent until the N+1 clock cycle when the frequency of the operation clock detected by the frequency detector 47 is less than the predetermined frequency.

Data stored in the stack unit 44 is sequentially output to the outside through the parallel to serial converter 45 and the output buffer 46. The parallel to serial converter 45 is controlled by a clock (CLKLC) that is obtained when the latency control circuit 49 delays a control clock (CLKDQ) generated in the delay synchronization loop (DLL) 48 for a predetermined time.

The frequency detector 47 determines whether the frequency of the operation clock (CLK) is a high frequency or a low frequency (e.g. above or below a predefined frequency), based on the relationship of Ta+Tb to TCC/2. That is, if Ta+Tb is greater than or equal to TCC/2, the frequency detector 47 determines that the frequency of the operation clock (CLK) is greater than the predetermined frequency (i.e. a high frequency), and if Ta+Tb is less than TCC/2, determines that the frequency of the operation clock (CLK) is less than the predetermined frequency (i.e. a low frequency). Ta denotes a time for stably storing a first data item 00 in the stack unit 44 after a read command (READ) is input, and Tb denotes a time for aligning the data to the falling edge of the system clock (CLK) from the rising edge of the control clock (CLKDQ) generated in the DLL 48 to the falling edge of the operation clock (CLK).

Figure 5:
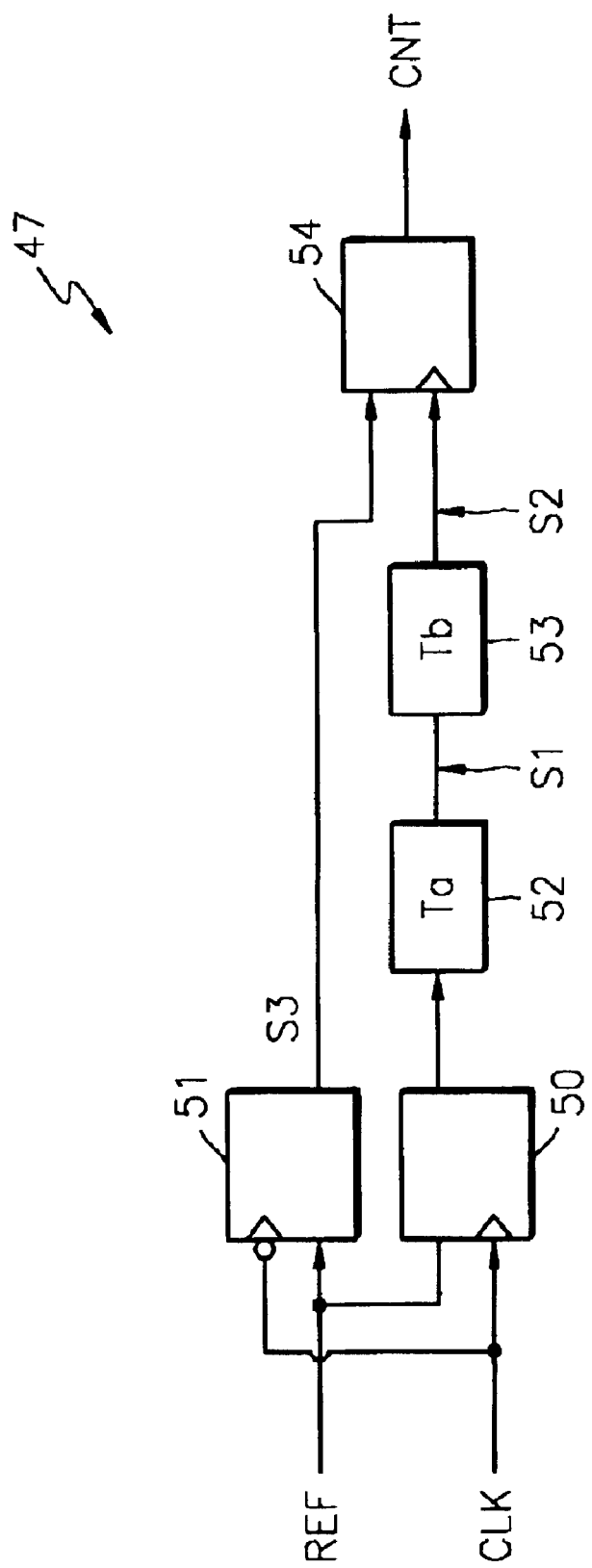
FIG. 5 is a detailed circuit diagram of embodiments of a frequency detector shown in FIG. 4.

FIG. 5 is a detailed circuit diagram of a frequency detector shown in FIG. 4 according to certain embodiments of the present invention. Referring to FIG. 5, the frequency detector 47 includes a first latch 50, a second latch 51, a first delay 52, a second delay 53, and a third latch 54.

The first latch 50 latches a reference signal (REF) in response to the rising edge of the operation clock (CLK), and the second latch 51 latches the reference signal (REF) in response to the falling edge of the operation clock (CLK). The first delay 52 delays the output signal of the first latch 50 for Ta, and the second delay 53 delays the output signal (S1) of the first delay 52 for Tb. The third latch 54 latches the output signal (S3) of the second latch 51 in response to the rising edge of the output signal (S2) of the second delay 53, and outputs the latched value as the output signal (CNT) of the frequency detector 47.

Since Ta and Tb are fixed values, and in a design stage, predictable values, the first delay 52 and the second delay 53 may be formed so as to have delay time corresponding to these values. Furthermore, a DLL reset signal (e.g., a signal which is maintained at a "high" logic level until the DLL 48 is reset again after the DLL 48 is reset) may be used as the reference signal (REF).

Figure 6:
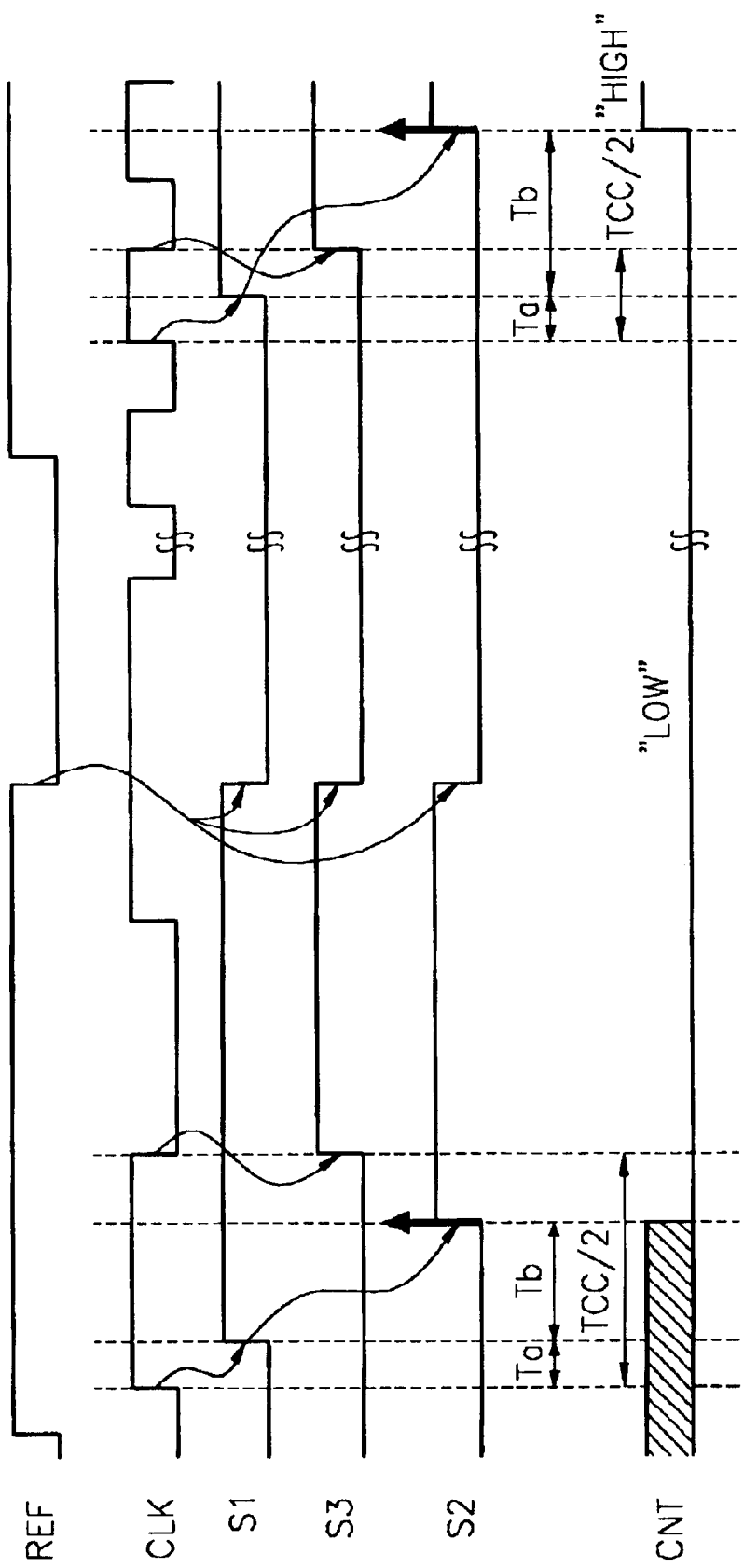
FIG. 6 is a timing diagram of the frequency detector shown in FIG. 5.

FIG. 6 is a timing diagram of the frequency detector shown in FIG. 5. Referring to FIG. 6, if Ta+Tb is less than TCC/2, the output signal (CNT) of the frequency detector 47 becomes a "low" logic level. As seen in FIG. 6, REF is clocked into the latch 50 on the rising edge of CLK and S1 is generated as the output of the latch 50 delayed Ta. S2 is generated as S1 delayed by Tb. REF is clocked into the latch 51 on the falling edge of CLK to provide S3. Because Ta+Tb is less than TCC/2, S3 has not transitioned to a "high" level and a logic "low" value is clocked into the latch 54. Thus, it is determined that the frequency of the operation clock (CLK) is less than a predetermined frequency (i.e., a low frequency) and, therefore, the path represented by the dotted line in the control circuit 43 of FIG. 4 is selected.

FIG. 6 also illustrated high frequency operation. As seen in FIG. 6, after some time (actions not shown to scale), the REF signal transitions back to a logic "low" value and subsequently high frequency operation is established. As seen in FIG. 6, the REF signal at a "low" value may serve to reset the circuit 47. When high frequency operation is begun and REF transitions from a "low" to a "high," REF is clocked into the latch 50 on the rising edge of CLK and S1 is generated as the output of the latch 50 delayed Ta. S2 is generated as S1 delayed by Tb. REF is clocked into the latch 51 on the falling edge of CLK to provide S3. Because Ta+Tb is greater than TCC/2, S3 has transitioned to a "high" level and a logic "high" value is clocked into the latch 54. Thus, if Ta+Tb is greater than TCC/2, the output signal (CNT) of the frequency detector 47 becomes a "high" logic level. That is, it is determined that the frequency of the operation clock (CLK) is greater than or equal to the predetermined frequency (i.e., a high frequency) and, therefore, the path represented by a solid line in the control circuit 43 of FIG. 4 is selected.

Figure 7:
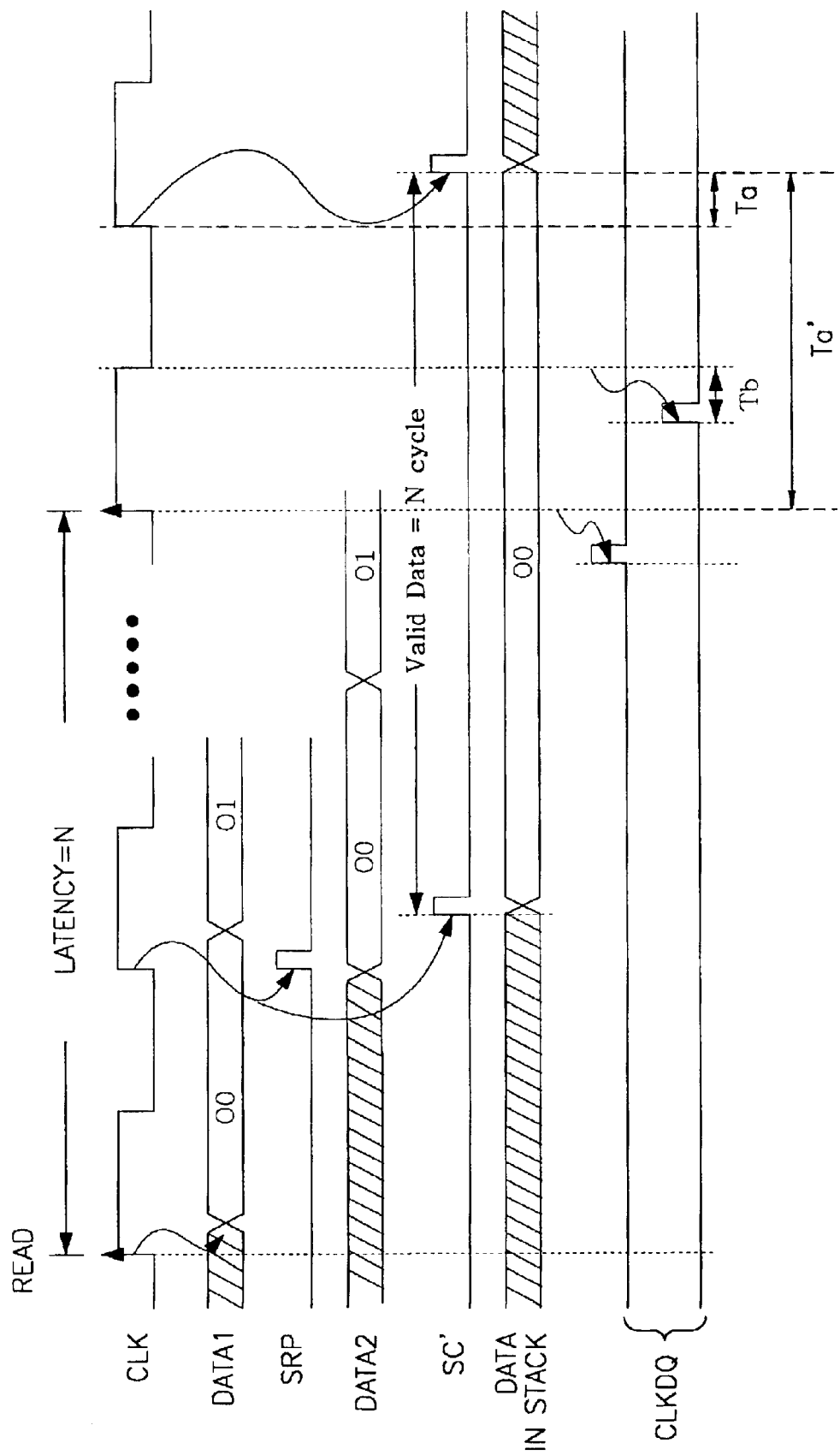
FIG. 7 is a timing diagram of the synchronous DRAM according to embodiments of the present invention of FIG. 4 operating at a low frequency.

FIG. 7 is a timing diagram of the synchronous DRAM according to certain embodiments of the present invention as illustrated in FIG. 4 operating at a low frequency. As shown in the timing diagram of FIG. 7, if it is determined by the frequency detector 47 that the frequency of the operation clock (CLK) is a low frequency, the control signal (SRP) is activated at every cycle from one clock cycle after a read command is sent until the N+1 clock cycle after the read command is sent, and the second latch 432 latches data (DATA1) in response to activation of the control signal (SRP), and outputs the latched data as data (DATA2). Therefore, data (DATA1) is delayed for one clock cycle, and outputs as data (DATA2).

Next, the stack counter 435 counts the pulses of the control signal (SRP), and activates the output signal (SC') with a period of N cycles from one clock cycle after the read command is sent until the N+1 clock cycle after the read command is sent. Accordingly, the stack unit 44 stores data (DATA2) from one clock cycle after the read command is sent until the N+1 clock cycle after the read command is sent. Therefore, a time (Ta'), which is taken from a time when the read command (READ) is input until a time when the first data item (00) is stably latched, is increased to Ta+TCC. Ta'+TCC is greater than TCC/2 and, therefore, a failure resulting from low frequency operation that occurs in the prior art technology may be prevented.

Data stored in the stack unit 44 is sequentially output through the parallel to serial converter 45 and the output buffer 46 controlled by the control clock (CLKDQ).

As described above, in the synchronous DRAM having a wave pipeline structure according to embodiments of the present invention, the number of registers or storage units in the stack is maintained at N, and when the frequency of the operation clock (CLK) is a high frequency, data (DATA1) is stored from a clock cycle when a read command is sent until the N-th clock cycle, while when the frequency of the operation clock (CLK) is a low frequency, data (DATA2) is stored from one clock cycle after the read command is sent until the N+1 clock cycle after the read command is sent. Accordingly, since the number of registers or storage units in the stack is maintained at N, the high frequency characteristics are not degraded, and when the frequency of the operation clock (CLK) is a low frequency, the DRAM operates as if the number of registers or storage units is N+1, and the failure due to a low frequency operation may be prevented.

While the present invention has been particularly shown and described with reference to specific embodiments thereof, it will be understood by those skilled in the art that various changes in form and details may be made therein without departing from the spirit and scope of the invention as defined by the appended claims.

What is claimed is:

1. A synchronous semiconductor memory device that operates synchronized with an operation clock and having a latency N clock cycles, where (N is an integer, comprising:
    a memory cell array;
    a stack unit having N storage units;
    a frequency detector configured to determine a relationship of a frequency of the operation clock with reference to a predetermined frequency so as to provide an output signal based on the relationship of the frequency of the operation clock to the predetermined frequency; and
    a control circuit configured to control the stack unit in response to the output signal of the frequency detector, wherein the control circuit latches data read from the memory cell array and controls the stack unit so that the latched data is stored from a clock cycle when a read command is sent until an N-th clock cycle after the read command is sent if the frequency of the operation clock is greater than the predetermined frequency and delays the latched data for one clock cycle and controls the stack unit so that the delayed data is stored from one clock cycle after the read command is sent until an N+1 clock cycle after the read command is sent.

2. The memory device of claim 1, wherein the frequency detector comprises:
    a first latch that latches a reference signal in response to a first edge of the operation clock;
    a second latch that latches the reference signal in response to a second edge of the operation clock;
    a first delay unit that delays an output signal of the first latch for a first delay time;
    a second delay unit that delays an output signal of the first delay unit for a second delay time; and
    a third latch that latches an output signal of the second latch in response to a first edge of an output signal of the second delay unit and outputs the latched signal as the output signal of the frequency detector.

3. The memory device of claim 2, wherein the first edge of the operation clock is a rising edge of the operation clock, the second edge of the operation clock is a falling edge of the operation clock and the first edge of the output signal of the second delay unit is a rising edge of the output signal of the second delay unit.

4. The memory device of claim 2, wherein the predetermined frequency has a period of twice a sum of the delay of the first delay unit and the delay of the second delay unit.

5. The memory device of claim 2, wherein the first delay time is a time for the stack unit to stably store a first data item of the latched data after the read command is sent.

6. The memory device of claim 5, wherein the second delay time is a time from the rising edge of a control clock generated in a delay synchronization loop in the synchronous semiconductor memory device to a falling edge of the operation clock.

7. The memory device of claim 6, wherein the predetermined frequency has a period of twice a sum of the delay of the first delay unit and the delay of the second delay unit.

8. The memory device of claim 1, wherein the predetermined frequency has a period of twice a sum of a time for the stack unit to stably store a first data item of the latched data after the read command is sent and a time from the rising edge of a control clock generated in a delay synchronization loop in the synchronous semiconductor memory device to a falling edge of the operation clock.

9. The memory device of claim 1, wherein the control circuit comprises:
    a first latch that latches internal data read from the memory cell array in response to a first control signal;
    a second latch that latches data latched by the first latch in response to a second control signal, and outputs the latched data as the delayed data;
    a first selector that selects one of the data latched by the first latch and the delayed data in response to the output signal of the frequency detector, and outputs the selected data to the stack unit;
    a second selector that selects one of the first control signal and the second control signal in response to the output signal of the frequency detector; and
    a stack counter that counts pulses of the output signal of the second selector and outputs an output signal to the stack unit based on the counted pulses.

10. The memory device of claim 9, wherein the first control signal is a signal having pulses activated at every cycle from a clock cycle when the read command is sent until an N-th clock cycle after the read command is sent, if the frequency of the operation clock is at least the predetermined frequency.

11. The memory device of claim 10, wherein the stack counter counts the pulses of the first control signal when the first control signal is input through the second selector, and activates the output signal with a period of N cycles from a clock cycle when the read command is sent until the N-th clock cycle.

12. The memory device of claim 9, wherein the second control signal is a signal having pulses activated at every cycle from one clock cycle after when a read command is sent until an N+1 clock cycle after the read command is set, if the frequency of the operation clock is less than the predetermined frequency.

13. The memory device of claim 12, wherein the stack counter counts the pulses of the second control signal when the second control signal is input through the second selector, and activates the output signal with a period of N cycles from one clock cycle after when the read command is sent until N+1 clock cycles after the read command is sent.

14. A synchronous semiconductor memory device that operates synchronized with an operation clock and having a latency of N clock cycles, where N is an integer, comprising:

a memory cell array;

a frequency detector that provides an output signal based on a relationship between a frequency of the operation clock and a predetermined frequency;

a latch circuit, responsive to the output signal of frequency detector, that latches data read from the memory cell array if the frequency of the operation clock is at least the predetermined frequency and outputs latched data from a clock cycle when a read command is sent until an N-th clock cycle after the read command is sent, and delays the latched data for one clock cycle if the frequency of the operation clock is less than the predetermined frequency and outputs the delayed data from one clock cycle after the read command is sent until N+1 clock cycles after the read command is sent;

a stack counter that activates an output signal with a period of N cycles from a clock cycle when the read command is sent until the N-th clock cycle after the read command is sent if the frequency of the operation clock is at least the predetermined frequency and activates the output signal with a period of N cycles from one clock cycle after when the read command is sent until N+1 clock cycles after the read command is sent if the frequency of the operation clock is less than the predetermined frequency; and a stack unit responsive to the output signal of the stack counter, that stores the latched data from a clock cycle when the read command is sent until the N-th clock cycle after the read command is sent if the frequency of the operation clock is at least the predetermined frequency and stores the delayed data from one clock cycle after when the read command is sent until the N+1 clock cycle after the read command is sent if the frequency of the operation clock is less than the predetermined frequency.

15. The memory device of claim 14, wherein the frequency detector comprises:

a first latch that latches a reference signal in response to a first edge of the operation clock;

a second latch that latches the reference signal in response to a second edge of the operation clock;

a first delay unit that delays an output signal of the first latch for a first delay time;

a second delay unit that delays an output signal of the first delay for a second delay time; and a third latch that latches an output signal of the second latch in response to the output signal of the second delay unit and outputs the latched signal as the output signal of the frequency detector.

16. The memory device of claim 15, wherein the first edge of the operation clock is a rising edge of the operation clock, the second edge of the operation clock is a falling edge of the operation clock and the third latch latches the output signal of the second latch on a rising edge of the output signal of the second delay unit.

17. The memory device of claim 15, wherein the predetermined frequency has a period of twice a sum of the delay of the first delay unit and the delay of the second delay unit.

18. The memory device of claim 15, wherein the first delay time is a time for the stack unit to stably store a first data item of the latched data after the read command is sent.

19. The memory device of claim 18, wherein the second delay time is a time from the rising edge of a control clock generated in a delay synchronization loop in the synchronous semiconductor memory device to a falling edge of the operation clock.

20. The memory device of claim 19, wherein the predetermined frequency has a period of twice a sum of the delay of the first delay unit and the delay of the second delay unit.

21. The memory device of claim 14, wherein the predetermined frequency has a period of twice a sum of a time for the stack unit to stably store a first data item of the latched data after the read command is sent and a time from the rising edge of a control clock generated in a delay synchronization loop in the synchronous semiconductor memory device to a falling edge of the operation clock.

22. The memory device of claim 14, wherein the control circuit comprises:

a first latch that latches internal data read from the memory cell array in response to a first control signal so as to provide internal latched data;

a second latch that latches the internal latched data in response to a second control signal, and outputs the latched internal latched data as the delayed data; and a selector unit responsive to the output signal of the frequency detector that selects the internal latched data when the frequency of the operation clock is at least the predetermined frequency or selects the delayed data when the frequency of the operation clock is less than the predetermined frequency, and outputs the selected data to the stack unit.

23. The memory device of claim 22, wherein the first control signal has pulses activated at every cycle from a clock cycle when the read command is sent until an N-th clock cycle after the read command is sent, if the frequency of the operation clock is at least the predetermined frequency.

24. The memory device of claim 22, wherein the second control signal has pulses activated at every cycle from one clock cycle after when a read command is sent until N+1 clock cycles after the read command is sent, if the frequency of the operation clock is less than the predetermined frequency.

25. A method of controlling a wave pipeline synchronous semiconductor memory device that operates synchronized with an operation clock and has a latency N, where N is an integer, the method comprising:

determining a relationship between the frequency of the operation clock and a predetermined frequency;

latching data read from a memory cell array from a clock cycle when a read command is sent to the memory cell array until an N-th clock cycle after the read command is sent;

delaying the data latched from the memory cell array for one clock cycle; and selectively storing the latched data or the delayed data in a stack unit based on the determined relationship between the frequency of the operation clock and the predetermined frequency.

26. The method of claim 25, wherein the step of delaying comprises delaying data latched from the memory cell array for one clock cycle if the frequency of the operation clock is less than the predetermined frequency.

27. The method of claim 25, wherein the step of selectively storing comprises the steps of:

storing the latched data in the stack unit if the frequency of the operation clock is at least the predetermined frequency; and storing the delayed data in the stack unit if the frequency of the operation clock is less than the predetermined frequency.

28. The method of claim 25, wherein the predetermined frequency is a frequency having a period of twice a sum of a first time that is needed in stably store a first data item of the latched data after the read command is sent in the stack unit and a second time from a first edge of a control clock generated in a delay synchronization loop in the synchronous semiconductor memory device to a second edge of the operation clock.

* * * * *

UNITED STATES PATENT AND TRADEMARK OFFICE
CERTIFICATE OF CORRECTION

PATENT NO. : 6,778,464 B2 Page 1 of 1
DATED : August 17, 2004
INVENTOR(S) : Chung It is certified that error appears in the above-identified patent and that said Letters Patent is hereby corrected as shown below:

Title page,
Item [57], ABSTRACT,
Line 5, should read -- based on the relationship of the frequency of an operation clock --

Signed and Sealed this

Eighth Day of February, 2005

JON W. DUDAS
*Director of the United States Patent and Trademark Office*